United States Patent
Tsuji

(10) Patent No.: US 8,152,316 B2
(45) Date of Patent: Apr. 10, 2012

(54) IMAGING DEVICE

(75) Inventor: Yoshifumi Tsuji, Hachioji (JP)

(73) Assignee: Olympus Medical Systems Corp., Tokyo (JP)

(*) Notice: Subject to any disclaimer, the term of this patent is extended or adjusted under 35 U.S.C. 154(b) by 0 days.

(21) Appl. No.: 13/066,713

(22) Filed: Apr. 21, 2011

(65) Prior Publication Data

US 2011/0267696 A1 Nov. 3, 2011

(51) Int. Cl.
*G02B 27/00* (2006.01)
(52) U.S. Cl. .................... 359/601; 359/611
(58) Field of Classification Search ........... 359/601–614
See application file for complete search history.

(56) References Cited

U.S. PATENT DOCUMENTS

| | | | |
|---|---|---|---|
| 5,040,069 A * | 8/1991 | Matsumoto et al. | 348/76 |
| 2009/0086123 A1* | 4/2009 | Tsuji et al. | 349/58 |
| 2010/0259829 A1* | 10/2010 | Kim et al. | 359/609 |

FOREIGN PATENT DOCUMENTS

| | | |
|---|---|---|
| JP | 06-077448 | 3/1994 |
| JP | 07-311359 | 11/1995 |
| JP | 2006-080597 | 3/2006 |
| JP | 2006-094955 | 4/2006 |
| JP | 2007-014441 | 1/2007 |
| JP | 2007-301227 | 11/2007 |
| JP | 2008-034502 | 2/2008 |
| JP | 2009-066223 | 4/2009 |
| WO | WO 2008/081828 | 7/2008 |

* cited by examiner

*Primary Examiner* — Thong Nguyen
(74) *Attorney, Agent, or Firm* — Kenyon & Kenyon LLP

(57) ABSTRACT

An imaging device having a light-shielding area between a cover glass for imaging element and an optical member arranged adjacent to the cover glass, the light-shielding area having a light-transmitting area which is formed by a part of the light-shielding area on an edge of the optical member being cut off so that one or more corners on the boundary between an image area of the imaging element and the outside of the image area are locatable from the object side, and the following conditions (1) and (2) are satisfied:

$$0.3 \leq a/IH \leq 1.5 \tag{1}$$

$$a_1 \leq a \leq a_2' \tag{2}$$

where, $a_1 = IH - D \tan \theta_1$, $a_2'$ denotes the smallest value of the following values $a_2$, $a_3$, and $a_4$, $a_2 = 2b - IH - D \tan \theta_2$, $a_3 = b - (D/2) \times \tan \theta_3$, $a_4 = b - X$.

3 Claims, 6 Drawing Sheets

IMAGING DEVICE

BACKGROUND OF THE INVENTION

This invention relates to an imaging device which is provided with a light-shielding area between an imaging element for preventing flare and an optical member adjacent to the imaging element.

In imaging devices, there exists an imaging device which is provided with a light-shielding member in the vicinity of an imaging element in order to prevent flare. For example, Japanese Patent Kokai No. 2006-80597 discloses an imaging module which is provided with a stop member between an optical glass and a sensor chip and in which a stop is provided by giving a glass of a light-transmitting member deposition.

Also, Japanese Patent Kokai No. 2007-14441 discloses an imaging element package for electronic endoscope which is provided with a light-shielding area between a cover glass and a solid imaging device.

SUMMARY OF THE INVENTION

An imaging device according to the present invention is characterized in that the imaging device is provided with an light-shielding area between a cover glass for imaging element and an optical member arranged adjacently to the cover glass, the light-shielding area includes a light-transmitting area which is formed by cutting a part of the light-shielding area on the edge of the optical member so that one or more corners on the boundary portion between an image area of the imaging element and the outside of the image area can be verified from the object side, and the following conditions (1) and (2) are satisfied:

$$0.3 \leq a/IH \leq 1.5 \quad (1)$$

$$a_1 \leq a \leq a_2' \quad (2)$$

where,
$a_1 = IH - D \tan \theta_1$, $a_2'$ denotes the smallest value of the following values $a_2$, $a_3$, and $a_4$,
$a_2 = 2b - IH - D \tan \theta_2$,
$a_3 = b - (D/2) \times \tan \theta_3$,
$a_4 = b - X$,
besides, a denotes the distance between the optical axis of the imaging element and the light-shielding area, IH denotes the largest image height in predetermined directions which go from the optical axis of the imaging element toward the light-shielding area and in which the distance between the optical axis of the imaging element and the light-shielding area becomes equal to a, D denotes the thickness of the cover glass, $\theta_1$ denotes the angle at which light rays having the largest light-ray height in the light-shielding area among light rays directly incident on the positions corresponding to the largest image height in the imaging element cross the optical axis, b denotes the distance between the central axis of the cover glass and the lateral surface of the cover glass in predetermined directions which go from the optical axis of the imaging element toward the light-shielding area and in which the distance between the optical axis of the imaging element and the light-shielding area becomes equal to a, $\theta_2$ denotes the angle at which light rays having the largest light-ray height in the light-shielding area among light rays that are reflected by the lateral surface of the cover glass and directly incident on the positions corresponding to the largest image height cross the optical axis, $\theta_3$ denotes the angle at which light rays having the largest light-ray height in the light-shielding area among light rays incident on the middle portion of the lateral surface of the cover glass cross the optical axis in predetermined directions which go from the optical axis of the imaging element toward the light-shielding area and in which the distance between the optical axis of the imaging element and the light-shielding area becomes equal to a, and X denotes the height of a burr on the object-side surface of the cover glass in predetermined directions which go from the optical axis of the imaging element toward the light-shielding area and in which the distance between the optical axis of the imaging element and the light-shielding area becomes equal to a.

Also, an imaging device of the present invention is preferably formed in such a way that the light-shielding area includes a light-transmitting area on the optical member's-edge side.

Also, in an imaging device of the present invention, the external diameter of the light-shielding area is preferably larger than that of the cover glass.

Also, in an imaging device of the present invention, the light-shielding area is preferably formed by giving the optical member deposition or printing.

The features and advantages of the present invention will become apparent from the following detailed description of the embodiments when taken in conjunction with the accompanying drawings.

DETAILED DESCRIPTION OF THE PREFERRED EMBODIMENTS

Figure 1:
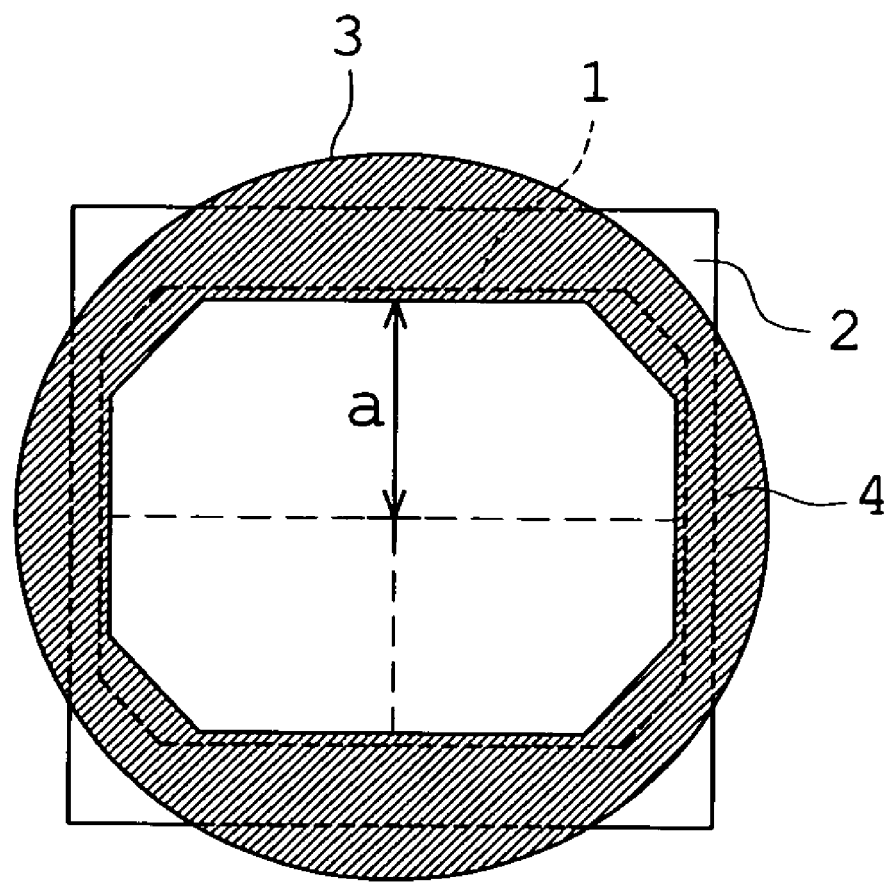
FIG. 1 is a plane view for explaining the conditions (1) and (2) for an embodiment 1 of imaging devices of the present invention.
Figure 2A:
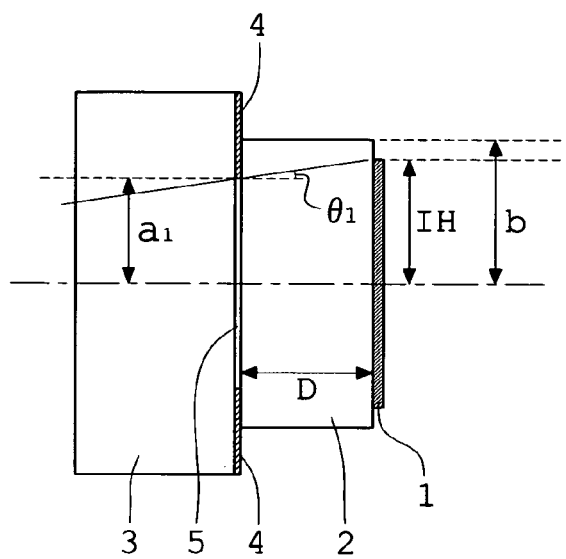
FIG. 2 is a side view for explaining the conditions (1) and (2) for the imaging device of the embodiment 1.
Figure 2B:
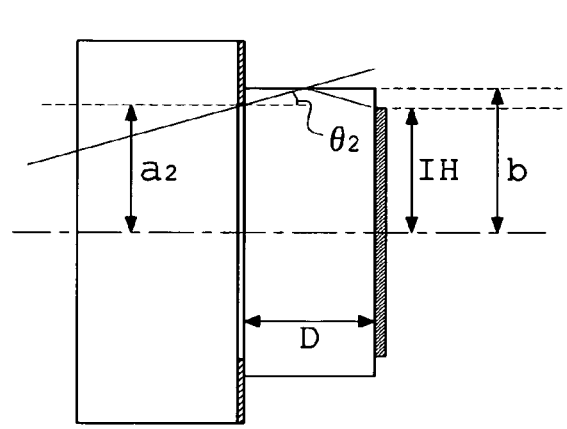
Figure 2C:
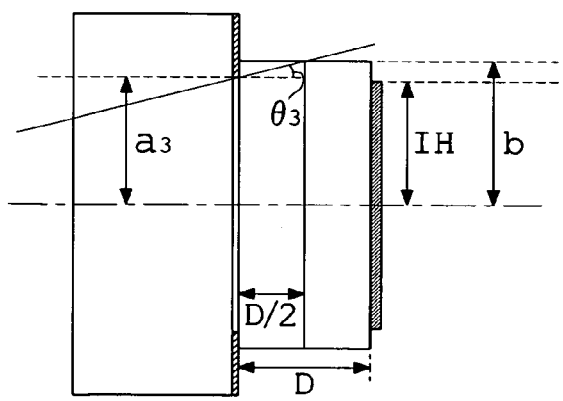
Figure 2D:
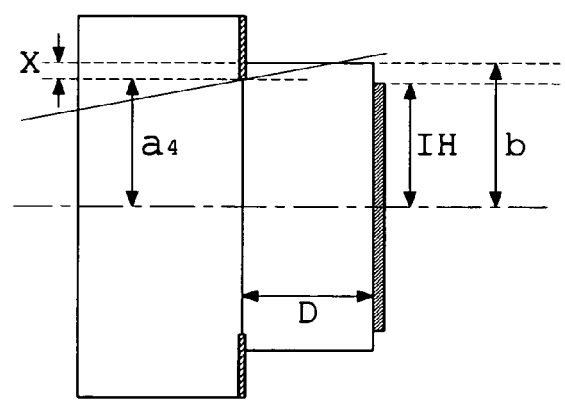

Prior to the explanations of the embodiments, operation effects in imaging devices of the present invention will be explained.

An imaging device of the present invention is characterized in that the imaging device is provided with an light-shielding area between a cover glass for imaging element and an optical member arranged adjacently to the cover glass, the light-shielding area includes a light-transmitting area which is formed by cutting a part of the light-shielding area on the edge of the optical member so that one or more corners on the boundary portion between an image area of the imaging element and the outside of the image area can be verified from the object side, and the following conditions (1) and (2) are satisfied:

$$0.3 \leq a/IH \leq 1.5 \quad (1)$$

$$a_1 \leq a \leq a_2' \quad (2)$$

where,
$a_1 = IH - D \tan \theta_1$, $a_2'$ denotes the smallest value of the following values $a_2$, $a_3$, and $a_4$,
$a_2 = 2b - IH - D \tan \theta_2$,
$a_3 = b - (D/2) \times \tan \theta_3$,
$a_4 = b - X$,
besides, a denotes the distance between the optical axis of the imaging element and the light-shielding area, IH denotes the largest image height in predetermined directions which go from the optical axis of the imaging element toward the light-shielding area and in which the distance between the optical axis of the imaging element and the light-shielding area becomes equal to a, D denotes the thickness of the cover glass, $\theta_1$ denotes the angle at which light rays having the largest light-ray height in the light-shielding area among light rays directly incident on the positions corresponding to the largest image height in the imaging element cross the optical axis, b denotes the distance between the central axis of the cover glass and the lateral surface of the cover glass in predetermined directions which go from the optical axis of the imaging element toward the light-shielding area and in which the distance between the optical axis of the imaging element and the light-shielding area becomes equal to a, $\theta_2$ denotes the angle at which light rays having the largest light-ray height in the light-shielding area among light rays that are reflected by the lateral surface of the cover glass and directly incident on the positions corresponding to the largest image height cross the optical axis, $\theta_3$ denotes the angle at which light rays having the largest light-ray height in the light-shielding area among light rays incident on the middle portion of the lateral surface of the cover glass cross the optical axis in predetermined directions which go from the optical axis of the imaging element toward the light-shielding area and in which the distance between the optical axis of the imaging element and the light-shielding area becomes equal to a, and X denotes the height of a burr on the object-side surface of the cover glass in predetermined directions which go from the optical axis of the imaging element toward the light-shielding area and in which the distance between the optical axis of the imaging element and the light-shielding area becomes equal to a.

In accordance with the shape of the image area of the imaging element, as shown in FIG. 1 for example, a light-shielding area 4 is provided for an optical member 3 which is adjacent to a cover glass 2 that is provided in front of an image area 1, through deposition and in such a way that the conditions (1) and (2) are satisfied. Light rays outside the field of view are adequately shielded by the light-shielding area 4, so that flare is prevented.

In this case, when $a_1$ to $a_4$ in the condition (2) are illustrated, $a_1$ to $a_4$ are such as these are shown in FIG. 2. Vertical opposite sides, horizontal opposite sides, and diagonals are found respectively on the basis of the condition (2), so that it is possible to set the shape of a necessary light-shielding area.

If the length a of the light-shielding area falls below $a_1$, the light-shielding area inevitably intercepts a light ray which enters from the object side, passes through the light-transmitting area of the optical member, and enters the image area of the imaging element, so that light rays entering the receiving portion are reduced and become dark light. Also, if the length a of the light-shielding area exceeds $a_2'$, light rays which enter from the object side and pass through the light-transmitting area of the optical member are reflected by the lateral surface of the cover glass and enter the image area, so that the light rays appear as flare.

Also, instead of the condition (1), it is preferred that the following condition (1') is satisfied:

$$0.85 \leq a/IH \leq 1.2 \quad (1')$$

In addition, it is preferred still more that the following condition (1") is satisfied:

$$0.9 \leq a/IH \leq 1.1 \quad (1'')$$

And, the light-shielding area is formed in such a way that at least one or more parts of the boundary portion between the image area of the imaging element and the outside of the image area can be verified from the object side.

Figure 3:
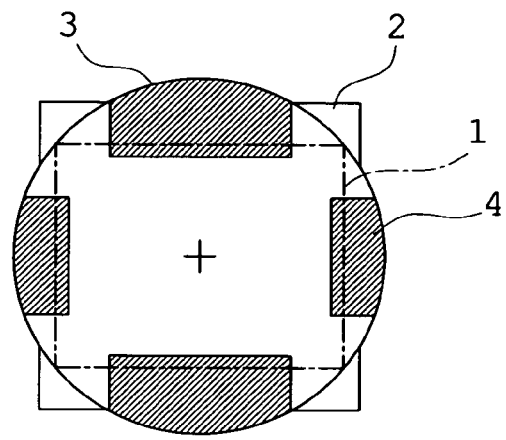
FIG. 3 is a plane view of an embodiment 2 for imaging devices of the present invention.

For example, as shown in FIG. 3, the four corners of the light-shielding area are cut so that the boundary portion between the image area and the outside of the image area can be verified from the object side. As a result, it is possible to improve the performance of centering.

And, the light-shielding area is formed in such a way that the light-shielding area includes a light-transmitting area which is formed by cutting a part of the light-shielding area on the edge of the optical member so that one or more corners on the boundary portion can be verified.

Figure 4:
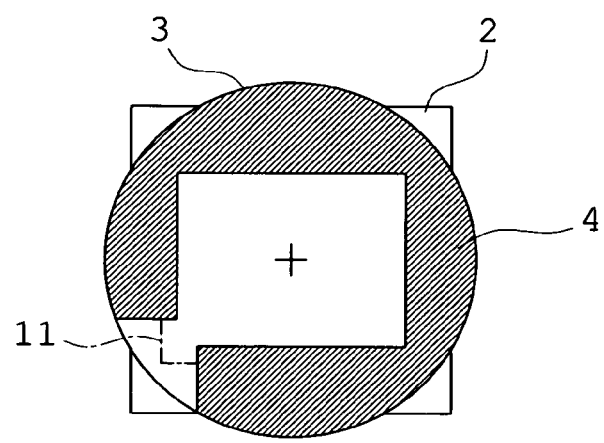
FIG. 4 is a plane view of an embodiment 3 for imaging devices of the present invention.

For example, as shown in FIG. 4, when a corner on the boundary portion can be verified no matter that the number of corners that can be verified is one, it is possible to perform centering on the basis of the verified corner.

Also, an imaging device of the present invention is preferably formed in such a way that the light-shielding area includes a light-transmitting area on the optical member's-edge side.

Figure 6:
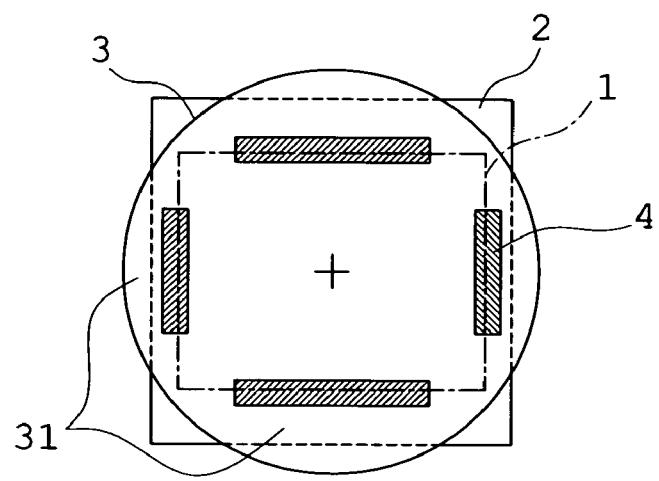
FIG. 6 is a plane view of an embodiment 5 for imaging devices of the present invention.
Figure 7:
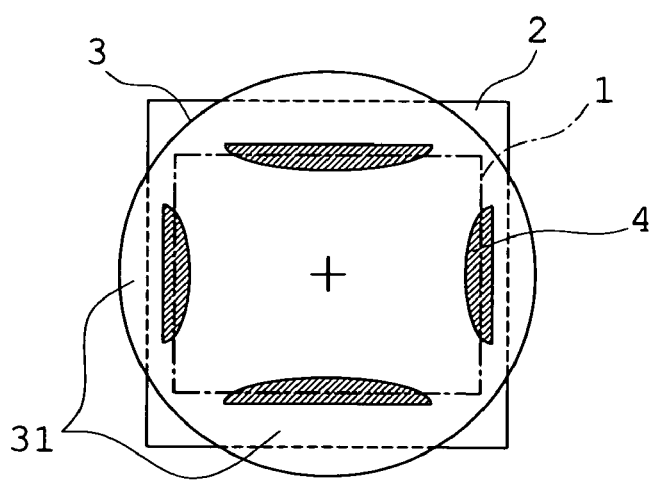
FIG. 7 is a plane view showing a variation of the embodiment 5 for imaging devices of the present invention.

For example, as shown in FIGS. 6 and 7, the light-shielding area is made to have a shape by which the optical member's edge side includes a light-transmitting area, so that it is possible to increase an UV-transmitting area and to improve an effect on bond.

Also, an imaging device of the present invention is preferably formed in such a way that the external diameter of the light-shielding area is larger than that of the cover glass.

Figure 8A:
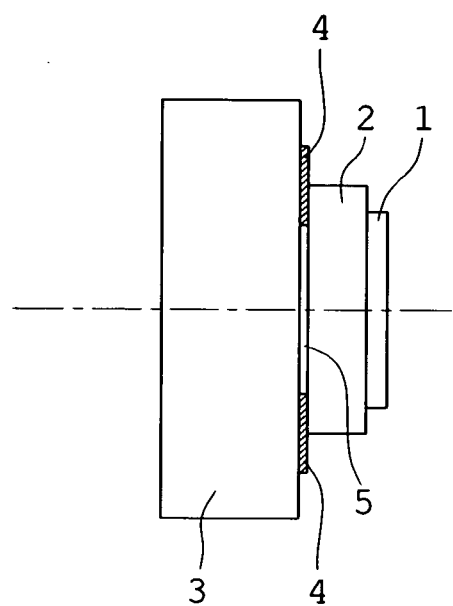
FIG. 8 is a side view for explaining the relation between the external diameters of light-shielding area and cover glass for the imaging device of the embodiment 5, (A) shows the relation in the case where the necessary condition in claim 3 is satisfied, and (B) shows the relation in the case where the necessary condition in claim 3 is not satisfied.
Figure 8B:
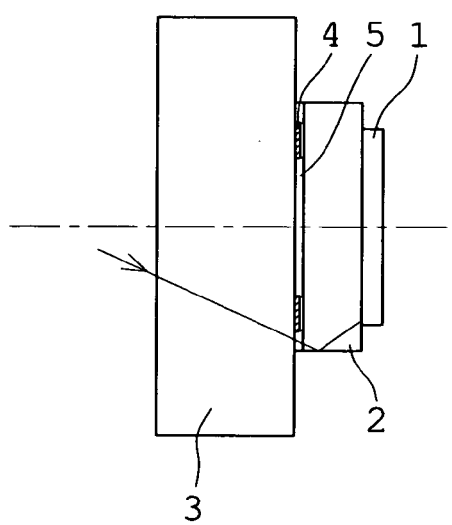

As shown in FIG. 8 (B), in the case where the external diameter of the light-shielding area is smaller than that of the cover glass, light rays pass through the outside of the light-shielding area and inevitably enter the cover glass, so that it is impossible to achieve the prevention against flare.

Also, in an imaging device of the present invention, the light-shielding film of the light-shielding area is preferably made to have a thickness of 0.1 µm to 10 µm. It is because the light-shielding area only has to acquire a necessary capability of shielding light.

Also, in an imaging device of the present invention, the light-shielding area is preferably formed by a light-shielding film the transmittance of which is 5% or less in a wavelength range of 350 to 780 nm. The use of light-shielding film the transmittance of which is extremely low throughout a widespread wavelength range makes it possible to surely prevent flare. Besides, in order to more improve an effect on UV bonding in certain cases, light-shielding film the transmittance of which is high for ultraviolet rays may be used.

Also, in an imaging device of the present invention, optical members the transmittance of which is 90% or more in a wavelength range of 350 to 780 nm are preferably used. Because unnecessary light rays are excluded by the light-shielding area, optical members having high transmittance can be used without excluding a specific wavelength range.

Also, an imaging device of the present invention is preferably formed in such a way that the light-shielding area is formed by giving the optical member deposition or printing. When imaging devices of the present invention are formed like this, the imaging devices are particularly useful.

The embodiments for imaging devices according to the present invention will be explained on the basis of the drawings below.

Embodiment 1

The present embodiment is used for explaining the conditions (1) and (2). As shown in FIGS. 1 and 2, the light-shielding area 4 is formed by performing deposition to the optical member 3 which is adjacent to the cover glass 2 that is provided in the front of the image area 1, in accordance with the shape of the image area 1 of the imaging element. And, the surface of the optical member 3 on which the light shielding member 4 is formed is bonded with the cover glass 2 with UV adhesive 5 while the cover glass 2 is being centered on the light-shielding-member-4-forming side surface of the optical member 3.

The image area 1 is shaped like octagon in the example which is illustrated, and an example of the optical member 3 which is illustrated is shaped like circle. The external diameter of the light-shielding area 4 corresponds with that of the optical member 3, and the internal diameter satisfies the conditions (1) and (2) and is shaped like octagon in accordance with the shape of the image area 1. Besides, imaging devices of the present invention practically is formed in such a way that the light-shielding area includes a light-transmitting area which is formed by cutting a part of the light-shielding area, as explained from the embodiment 2 downward.

When vertical opposite sides, horizontal opposite sides, and diagonals are found respectively in such a way that the light-shielding-area length a which is shown in FIG. 1 satisfies the conditions (1) and (2), a necessary light-shielding-area diameter can be set. According to the imaging device of the embodiment 1 formed like this, the light-shielding area 4 for preventing flare does not intercept proper light rays which enter the image area 1, and also, flare light which is reflected by the lateral surface of the cover glass 2 does not enter the image area 1. As a result, it is possible to effectively prevent flare.

Numerical value examples for the present embodiment are shown below.

Numerical Value Example 1

The present numerical value example is used in the case where $a_2'=a_3$.

IH=0.66
b=0.76
D=1.00
X=0.05
$\theta_1$=0.049 rad
$\theta_2$=0.155 rad
$\theta_3$=0.153 rad
$a_1$=0.611
$a_2$=0.704
$a_3$=0.683
$a_4$=0.710
$a_2'=a_3$=0.683
$a_{max}$/IH=1.035
$a_{min}$/IH=0.926

Numerical Value Example 2

The present numerical value example is used in the case where $a_2'=a_4$.

IH=0.42
b=0.52
D=0.40
X=0.05
$\theta_1$=0.033 rad
$\theta_2$=0.222 rad
$\theta_3$=0.210 rad
$a_1$=0.407
$a_2$=0.530
$a_3$=0.477
$a_4$=0.470
$a_2'=a_4$=0.470
$a_{max}$/IH=1.119
$a_{min}$/IH=0.969

Numerical Value Example 3

The present numerical value example is used in the case where $a_2'=a_2$.

IH=0.998
b=1.098
D=0.90
X=0.05
$\theta_1$=0.072 rad
$\theta_2$=0.225 rad
$\theta_3$=0.221 rad
$a_1$=0.933
$a_2$=0.992
$a_3$=0.997
$a_4$=1.048
$a_2'=a_2$=0.992
$a_{max}$/IH=0.994
$a_{min}$/IH=0.935

Besides, the light-shielding-area length a may become larger than the outer circumference of the optical member 3. Accordingly, as shown in the following embodiments, there is no necessity that the light-shielding area 4 is continuously formed in the outer circumference area of the optical member 3. That is to say, even though there exists a part of the optical member 3 on which the light-shielding area 4 does not exist, the conditions (1) and (2) may be satisfied.

Also, the shape of the light-shielding area 4 is mainly explained in the following embodiments. However, the imaging devices of the following embodiments have the same constitution as that of the imaging device of the above-described embodiment 1. Besides, a value of a which is found by the conditions (1) and (2) that determine the shape of the light-shielding area 4 is determined by various kinds of parameters as well as the shape of the image area 1.

Embodiment 2

In the imaging device of the embodiment 2, as shown in FIG. 3, the light-shielding area 4 has a shape in which the light-shielding area 4 is cut in the four corners correspondingly to the shape of the image area 1, as compared with the light-shielding area for the embodiment 1. As described above, because the light-shielding-area length a only has to satisfy the conditions (1) and (2), in the case where the a satisfying the conditions (1) and (2) is larger than the external diameter of the optical member 3 according to the shapes of image area 1 and the cover glass, light-shielding area which is provided on these portions of the optical member becomes unnecessary.

According to the imaging device of the embodiment 2, the light-shielding area 4 is cut in the four corners as described above, so that the boundary between the image area 1 and the outside of the image area can be verified form the object side through the light-transmitting area of the optical member 3. As a result, it is possible to improve the performance of centering.

Embodiment 3

In the imaging device of the embodiment 3, as shown in FIG. 4, the light-shielding area 4 has a shape in which part of the light-shielding area 4 is cut on the edge of the optical member 3 correspondingly to the corner 11 of the image area 1 of an imaging element. And, the corner 11 of the image area 1 of the imaging element can be verified through the cut part. According to the imaging device of the embodiment 3, as shown in the drawing, the corner 11 of the image area 1 can be verified no matter that the number of verified parts is one, so that it is possible to perform centering by using the verified part as a standard.

Embodiment 4

Figure 5:
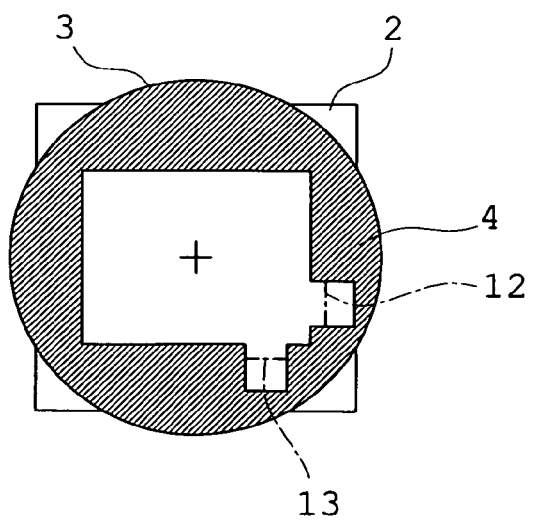
FIG. 5 is a plane view showing an embodiment 4 as a reference example of the present invention.

The imaging device of the embodiment 4 is shown as reference example for the present invention. As shown in FIG. 5, the light-shielding area 4 has a shape in which parts of the light-shielding area 4 which are on two sides 12 and 13 of the boundary portion of the image area 1 of the imaging element that are adjacent to each other are cut so that the two sides of the boundary portion can be verified through the light-transmitting area of the optical member 3. According to the imaging device of the embodiment 4, as shown in the drawing, although the light-shielding area is not cut in a corner of the image area, the two sides 12 and 13 which are adjacent to each other can be verified. As a result, it is possible to perform centering by using the two sides as a standard.

Embodiment 5

In the imaging device of the embodiment 5, as shown in FIG. 6, the light-shielding area 4 has a shape in which the light-shielding area for the above-described embodiment 1 is cut in the four corners correspondingly to the shape of the image area 1 and includes a light-transmitting area on the optical member 3's edge 31-side region. According to the imaging device of the embodiment 5 formed like this, when the cover glass 2 and the optical member 3 are bonded together with UV adhesive, UV-transmitting area increases, so that it is possible to improve the effect on bonding.

Also, as shown in FIG. 7 as a variation on the present embodiment, the light-shielding-area length a of the light-shielding area 4 may be enlarged within the range in which the light-shielding-area length satisfies the conditions (1) and (2) and be made to have a curved shape. Like the imaging device of the variation, when the shape of the light-shielding area 4 is made to become smaller, the UV-transmitting area increases more, so that it is possible to improve the effect on bonding more.

Also, heat curing adhesives may be used as an adhesive for the present embodiment.

Besides, in the case where the optical member 3's edge-side region 31 is used as a light-transmitting area as in the present embodiment, as shown in FIG. 8 (A), the light-shielding area 4 is formed in such a way that the external diameter of the light-shielding area 4 is larger than that of the cover glass 2. If the external diameter of the light-shielding area 4 is smaller than that of cover glass 2, as shown in (B) of the same drawing, light rays pass through the outside of the image-shielding area 4 and inevitably enter the cover glass 2. As a result, it is impossible to achieve the prevention against flare.

Embodiment 6

Figure 9:
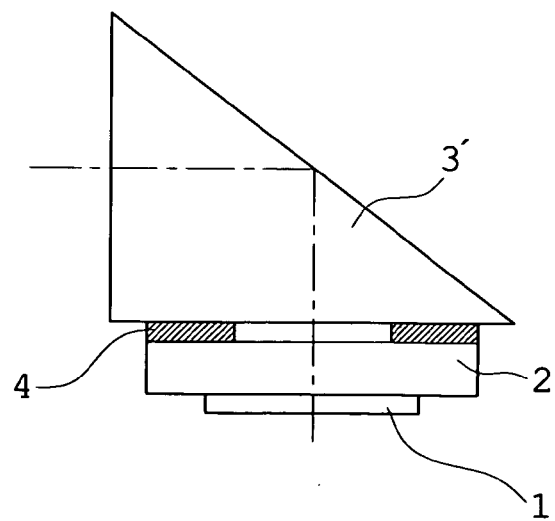
FIG. 9 is a side view of an embodiment 6 for imaging devices according to the present invention.

As shown in FIG. 9, the imaging device of the embodiment 6 is shown as an example in which a prism 3' is used as the optical member. Except that the prism 3' is used as the optical member, the same shapes of the light-shielding areas 4 as those in the above-described embodiments are applicable to the imaging devices of the present embodiment.

Embodiment 7

The present embodiment is shown as a reference example. A method of coating a light-transmitting area of the optical member 3 for imaging devices of the present invention with a metal thin film that reduces surface reflectance is explained on the basis of FIG. 10, while FIG. 10 is being compared with FIG. 11 that shows a conventional coating method.

Figure 11:
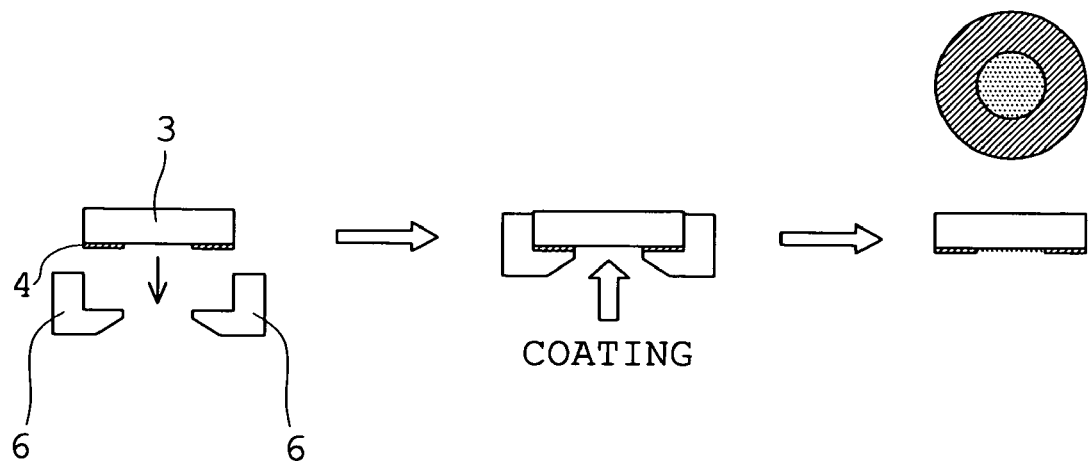
FIG. 11 is an explanatory view showing a conventional method for giving light-transmitting area of optical member anti-reflection coating.

In the case where a light-transmitting area of an optical member including a light-shielding area is given anti-reflection coating conventionally, as shown in FIG. 11, the optical member 3 is set on fixtures 6 having such shapes as the fixtures 6 exactly cover the light-shielding area 4, and only the light-transmitting area is coated with a metal film that reduces surface reflectance to prevent reflection. In such a method, the light-transmitting area and the fixtures have to be precisely joined. Accordingly, in the case where the light-transmitting area has a complex shape or the optical member is minute and its part accuracy is high, it is difficult to make a fixture for coating process or to join the fixture and the optical member. Also, because the light-shielding area is not given anti-reflection coat, the reflectance of the light-shielding area becomes high and causes flare in certain cases.

Figure 10:
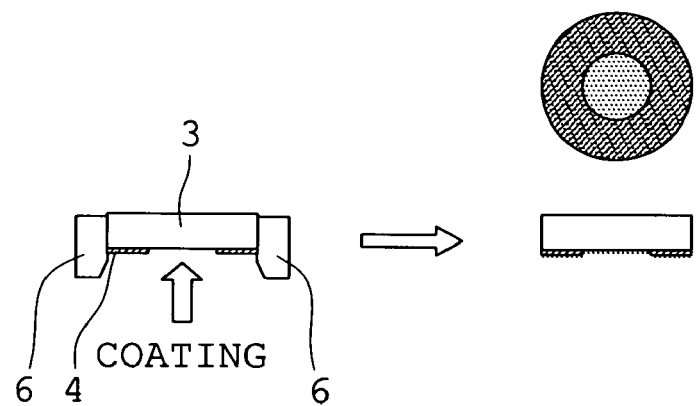
FIG. 10 is an explanatory view showing a method for giving light-transmitting area of optical member anti-reflection coating in the imaging device of an embodiment 7 according to the present invention.

Accordingly, as shown in FIG. 10, the imaging device according to the embodiment 7 of the present invention is formed in such a way that: the fixture 6 is made to have a shape by which the fixture 6 hardly covers the light-shielding area 4 that is formed on the optical member 3 in the imaging devices of the above-described embodiments; and the light-transmitting area and the light-shielding area of the optical member 3 are simultaneously coated with a metal thin film that reduces the same surface reflectance. According to the imaging device of the embodiment 7 formed like this, a metal film can be simultaneously formed regardless of the light-shielding area and the light-transmitting area. As a result, it is possible to extremely easily form a metal film and the surface reflectance of the light-shielding area and the surface reflectance of the light-transmitting area are reduced, so that it is possible to prevent reflected light from the image area from being reflected.

Besides, the light-shielding area may be provided on the cover-glass side in imaging devices of the present invention.

Also, imaging devices of the present invention are also applicable to the case where the light-shielding area is made of a metal thin plate. In this case, the thickness of the metal thin plate approximately ranges from 10 to 30 μm. And, the light-shielding area may be formed separately from the optical member and the cover glass, or the metal thin plate can be also bonded to the optical member in advance.

Imaging devices of the present invention can effectively prevent flare, and it is also possible to achieve improvement on an accuracy in centering the image area of an imaging element and the light-shielding area of an optical member. In addition, in the case where an UV-radiation curing adhesive is used in order to bond the optical member and the cover glass, the bonding is surely made by using the light-transmitting area as the minimum necessary area, so that imaging devices of the present invention can be used as imaging devices for various kinds of uses.

What is claimed is:

1. An imaging device having a light-shielding area between a cover glass for an imaging element and an optical member arranged adjacent to the cover glass, wherein the light-shielding area has a light-transmitting area that is formed by a part of the light-shielding area on an edge of the optical member being cut off so that one or more corners on a boundary between an image area of the imaging element and an outside of the image area are locatable from an object side, and the following conditions (1) and (2) are satisfied:

$$0.3 \leq a/IH \leq 1.5 \quad (1)$$

$$a_1 \leq a \leq a_2' \quad (2)$$

where $a_1 = IH - D \tan \theta_1$, and $a_2'$ denotes a smallest value among the following values $a_2$, $a_3$, and $a_4$:

$$a_2 = 2b - IH - D \tan \theta_2,$$

$$a_3 = b - (D/2) \times \tan \theta_3,$$

$$a_4 = b - X,$$

where a denotes a distance from an optical axis of the imaging element to the light-shielding area, IH denotes a largest image height in a predetermined direction, along which the distance from the optical axis of the imaging element to the light-shielding area is measured to be a, from the optical axis of the imaging element toward the light-shielding area, D denotes a thickness of the cover glass, $\theta_1$ denotes an angle formed by a light ray having a largest light-ray height at a position of the light-shielding area among light rays directly incident at a position corresponding to the largest image height in the imaging element with the optical axis, b denotes a distance from a center axis of the cover glass to a lateral surface of the cover glass in the predetermined direction, along which the distance from the optical axis of the imaging element to the light-shielding area is measured to be a, from the optical axis of the imaging element toward the light-shielding area, $\theta_2$ denotes an angle formed by a light ray having a largest light-ray height at the position of the light-shielding area among light rays that are reflected by the lateral surface of the cover glass to be directly incident at the position corresponding to the largest image height with the optical axis, $\theta_3$ denotes an angle formed by a light ray having a largest light-ray height at the position of the light-shielding area among light rays incident on a middle portion of the lateral surface of the cover glass in the predetermined direction, along which the distance from the optical axis of the imaging element to the light-shielding area is measured to be a, from the optical axis of the imaging element toward the light-shielding area, with the optical axis, and X denotes a height of a burr on an object-side surface of the cover glass in the predetermined direction, along which the distance from the optical axis of the imaging element to the light-shielding area is measured to be a, from the optical axis of the imaging element toward the light-shielding area.

2. An imaging device according to claim 1, wherein the light-shielding area is configured to have a light-transmitting area on a marginal side of the optical member.

3. An imaging device according to claim 2, wherein an outside diameter of the light-shielding area is larger than an outside diameter of the cover glass.

* * * * *